United States Patent [19]
Wong

[11] Patent Number: 5,497,025
[45] Date of Patent: Mar. 5, 1996

[54] METHODS TO FABRICATE LARGE HIGHLY REFLECTIVE METAL REFLECTOR PLATES FOR APPLICATIONS IN GAME CHIPS OR SIMILAR VIRTUAL IMAGE PROJECTION USE

[75] Inventor: George Wong, Singapore, Singapore

[73] Assignee: Chartered Semiconductor Manufacturing, Singapore, Singapore

[21] Appl. No.: 387,179

[22] Filed: Feb. 13, 1995

Related U.S. Application Data

[62] Division of Ser. No. 231,503, Apr. 22, 1994, Pat. No. 5,393,700.

[51] Int. Cl.$^6$ .................... H01L 31/0224; H01L 31/0232
[52] U.S. Cl. .................... 257/435; 257/414; 257/432; 257/763; 257/765; 257/752
[58] Field of Search .................... 257/379, 415, 257/417, 435, 432, 414, 763, 765, 752

[56] References Cited

U.S. PATENT DOCUMENTS

| | | | |
|---|---|---|---|
| 4,603,258 | 7/1986 | Sher et al. | 250/370 |
| 5,218,219 | 6/1993 | Ajika et al. | 257/752 |

FOREIGN PATENT DOCUMENTS 2137230  5/1990  Japan .

OTHER PUBLICATIONS

IEEE Spectrum, Oct. 1993, pp. 22–40, "Special Report Virtual Reality is for Real".

*Primary Examiner*—Jerome Jackson
*Attorney, Agent, or Firm*—George O. Saile; Stephen B. Ackerman

[57] ABSTRACT

A method, and resultant structure, for manufacturing large highly reflective metal reflector plates on an integrated circuit chip, for applications in game chips or similar virtual image projection systems, is described. A metal interconnection layer is formed above a semiconductor substrate, an intermetal dielectric layer is formed on the metal interconnection layer, and an opening is made through the intermetal dielectric layer to expose a portion of the metal interconnection layer. A first metal layer is formed on the intermetal dielectric layer and connecting to the metal interconnection layer through the opening. A second metal layer is formed on the first metal layer. A third metal layer is formed on the second metal layer. A highly reflective metal layer is formed on the third metal layer. The the first, second, third and highly reflective metal layers are patterned to form the highly reflective metal reflector plate. A passivation layer is formed over the highly reflective metal reflector plate and exposed surface of the intermetal dielectric layer. The passivation layer is etched above the highly reflective metal reflector plate to leave a portion of the passivation layer over the entire top surface of the highly reflective metal reflector plate. The portion of the passivation layer is removed with a wet etch, to expose the highly reflective metal reflector plate.

14 Claims, 4 Drawing Sheets

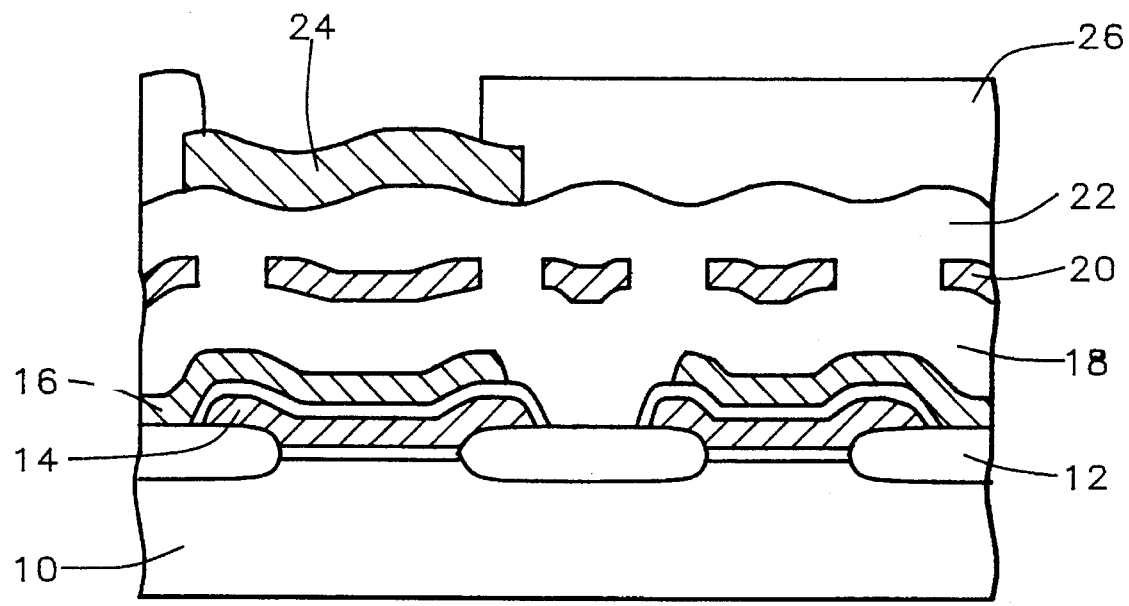
FIG. 1 - Prior Art
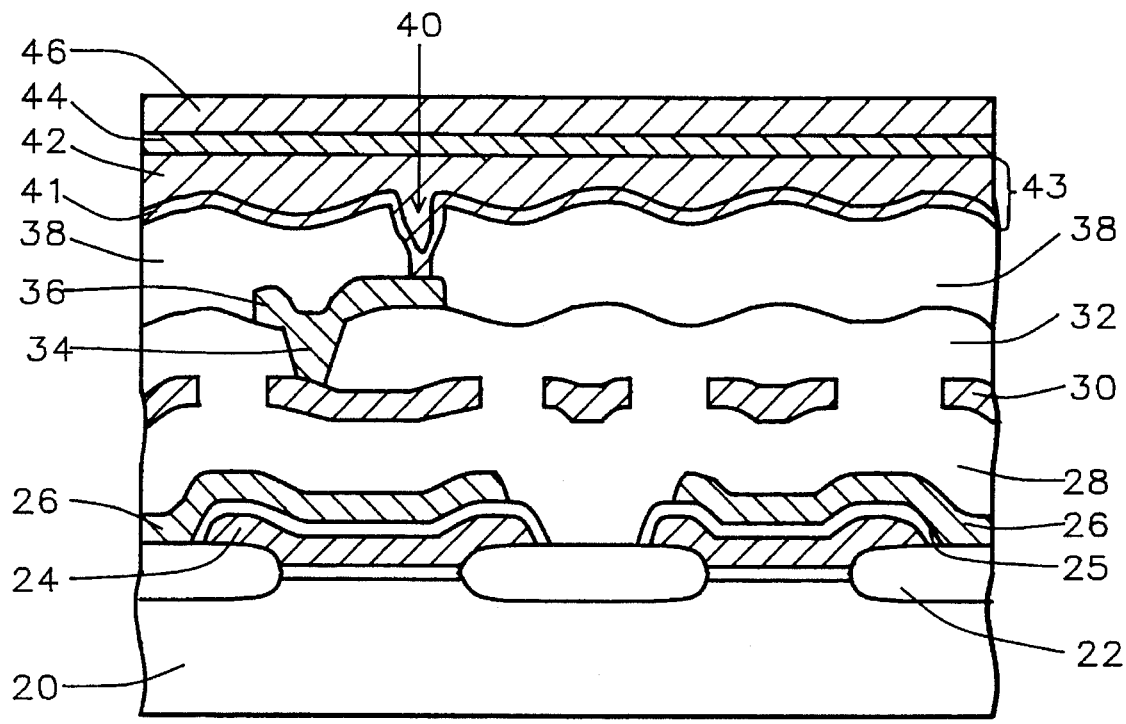
FIG. 2

METHODS TO FABRICATE LARGE HIGHLY REFLECTIVE METAL REFLECTOR PLATES FOR APPLICATIONS IN GAME CHIPS OR SIMILAR VIRTUAL IMAGE PROJECTION USE

This application is a division of application Ser. No. 08/231,503, filed Apr. 22, 1994, U.S. Pat. No. 5,393,700.

BACKGROUND OF THE INVENTION (1) Field of the Invention

The invention relates to reflective surfaces for use in virtual reality display devices, and more particularly to a method for making large highly reflective metal reflector plates for applications in game chips or similar virtual image projection systems.

(2) Description of the Related Art

Large reflective surfaces on integrated circuits are needed for applications such as virtual reality display devices. IEEE Spectrum, October 1993, pages 22–40 "Special Report: Virtual Reality is for Real" covering several papers, gives a general discussion of current virtual reality technology, wherein a very natural interface between humans and computers is created. Communication between a human and computer can take the form of moving 3-dimensional imagery, spatial sounds and even physical forces from motion to touching.

There is currently a need to provide large reflective metal, or the like, surfaces on the surface of integrated circuit memory chips for use in virtual reality display devices. I/O (Input/Output) pads with large metal surfaces are currently used on integrated circuit chips, but are not nearly large enough for a reflective metal area for virtual reality display purposes. Nor are I/O pads reflective enough to be used as reflective surfaces. Current capability for specularity, the degree of light that is scattered, is only 2%, while a specularity of about 80% is desirable.

In the prior art structure shown in FIG. 1, a memory cell has been formed on semiconductor substrate 10, including field oxide isolation regions 12, polysilicon layers 14 and 16, all formed as is well known in the art. An insulating layer 18 is formed on second polysilicon layer 16 and in openings in the polysilicon. This layer is formed of typically silicon oxide or the like. A first metal layer 20 is deposited and patterned, is typically of aluminum and is used for interconnection of devices to each other and to input/output pads. An intermetal dielectric (IMD) layer 22 is deposited over and between metal layer 20. It will be noted that each successive layer's top surface is uneven, due to the uneven surface on which the layers are deposited. A second metal layer is now deposited on the IMD layer and is typically aluminum. This metal layer is then patterned to form a metal pad 24, for I/O purposes and the like, and a passivation layer 26 is deposited and patterned above it to expose the metal pad. As shown in FIG. 1, the top surface is rough and uneven, due to the uneven nature of the top surface of the IMD layer beneath it, and due to the metal layer itself. The metal top surface is unacceptable for a reflector plate, but is adequate for I/O pads and the like, as the uneven surface will cause destructive interference of light waves impacting on the plate.

SUMMARY OF THE INVENTION

It is therefore an object of this invention to provide a very manufacturable method for fabricating, and a resulting structure of, a large, highly reflective metal reflector plate for virtual image projection applications.

This object is achieved by forming a metal interconnection layer above a semiconductor substrate, an intermetal dielectric layer on the metal interconnection layer, and an opening through the intermetal dielectric layer to expose a portion of the metal interconnection layer. A first metal layer is formed on the intermetal dielectric layer and connecting to the metal interconnection layer through the opening. A second metal layer is formed on the first metal layer. A third metal layer is formed on the second metal layer. A highly reflective metal layer is formed on the third metal layer. The first, second, third and highly reflective metal layers are patterned to form the highly reflective metal reflector plate. A passivation layer is formed over the highly reflective metal reflector plate and exposed surface of the intermetal dielectric layer. The passivation layer is etched above the highly reflective metal reflector plate to leave a portion of the passivation layer over the entire top surface of the highly reflective metal reflector plate. The portion of the passivation layer is removed with a wet etch, to expose the highly reflective metal reflector plate.

BRIEF DESCRIPTION OF THE DRAWINGS

FIG. 1 is a cross-sectional view of a metal structure using a prior art process in which the top surface is not sufficiently smooth for light reflection.

FIG. 2 to 6 are cross-sectional views of the method of the invention for manufacturing a large, highly reflective metal reflector plate.

DESCRIPTION OF THE PREFERRED EMBODIMENTS

Figure 3:
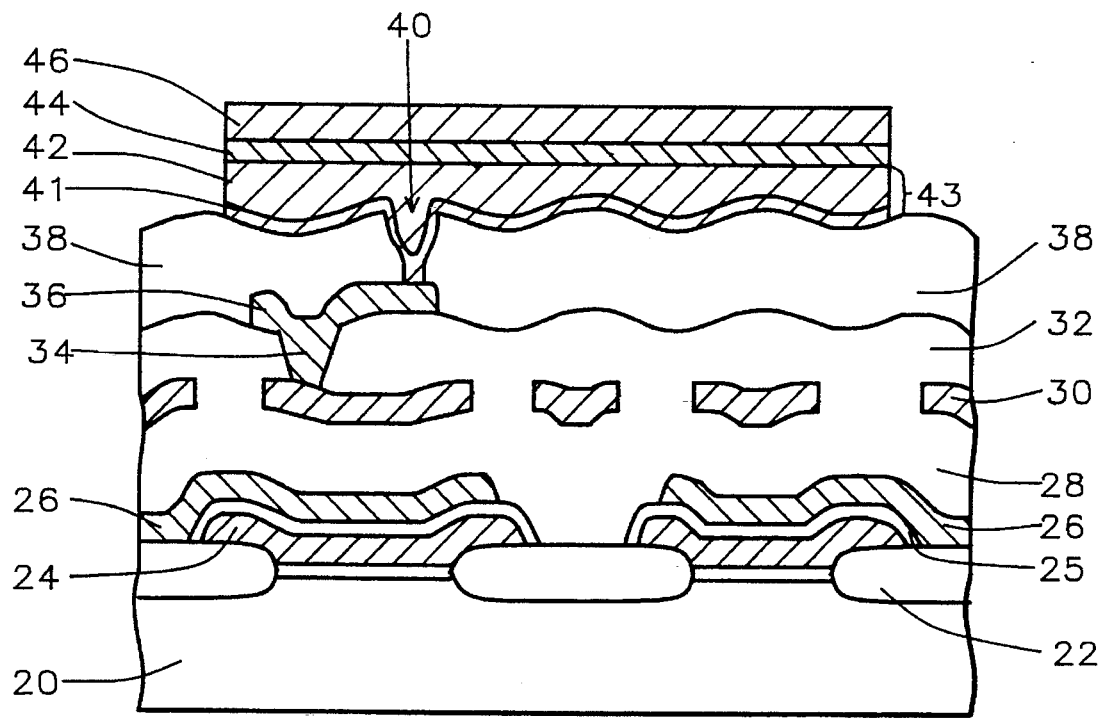

Referring now to FIG. 2, a memory cell, e.g., a DRAM (Dynamic Random Access Memory), SRAM (Static Random Access Memory), EEPROM (Electrically Eraseable Programmable Read Only Memory), ROM (Read Only Memory), etc., has been formed on semiconductor substrate 20. The memory cell can be industry standard, and the large reflector plate to be formed above it is independent of the underlying cell. Field oxide isolation regions 22 are formed by, for instance, LOCOS (LOCal Oxidation of Silicon), as is well known in the art. Polysilicon layers 24 and 26 are formed with an intermediate dielectric layer 25, and are formed and patterned as is well known in the art. These are a general representation of the underlying memory cell and are an example only. An insulating layer 28 is formed on second polysilicon layer 26 and in openings in the polysilicon. This layer is formed typically of silicon oxide or the like. An initial metal layer 30 is deposited and patterned and is typically aluminum. This layer is patterned into lines for interconnection of devices to each other and to input/output pads. A first IMD layer 32 is deposited over and between metal layer 30. It will be noted that each successive layer's top surface is uneven, due to the uneven surface on which the layers are deposited.

Openings are formed for vias in IMD layer 32 for interconnection of the subsequent metal layer to first metal 30. Another metal layer 36 is deposited on IMD layer 32 and is typically aluminum. The metal plate of the invention could be formed at this layer, or any subsequent layer, of metallization, but will be described as being formed at the third metallization layer. Metal 36 fills via 34 during deposition, and is then patterned as desired to form additional metal lines. Second IMD layer 38 is formed on the top surfaces of second metal 36 and first IMD layer 32. This layer is formed of an SOG (Spin On Glass) combination for planarization. Planarization of this layer is performed by one of two methods, but must be low temperature (less than about 400° C.) to avoid adverse affect to the aluminum reflective surface. Planarization can be by oxide/SOG/oxide, or oxide and chemical/mechanical polishing (CMP). Openings are formed in second IMD layer 38 to expose portions of second metal layer 36 for further interconnection. This is shown as via 40 in FIG. 2.

In the next critical steps of the invention, the metal layers for the metal reflector plate structure are formed. A metal layer 43, the bottom layer of the reflector plate structure, is now formed on IMD 38 and to fill via 40. This layer is formed of aluminum, deposited by a two-step process: (1) A cold layer 41 sputtered aluminum layer is deposited to a thickness of between about 1500 and 2000 Angstroms, at a temperature of between about 100° and 200° C., preferred temperature of less than 150° C., at a power of between about 5 and 10 kilowatts. (2) A hot layer 42 sputtered aluminum at a temperature of between about 475 and 550 Angstroms, to a thickness of between about 2000 and 5000 Angstroms, at a power of between about 5 and 10 kilowatts.

The top surface of layer 43 is still too rough a surface for reflection, due to a large grain size of between about 3 and 10 micrometers. To overcome this roughness, a third metal layer 44 is deposited. This layer is formed of Ti (titanium) or TiN (titanium nitride), or the like, which is cold sputtered to provide a small grain size layer from which the final cold Al layer will be seeded. The thickness of layer 44 is between about 400 and 800 Angstroms.

The fourth, and top, layer 46 of the metal reflector structure is formed of cold aluminum, deposited by one of two methods: (1) by sputtering Al cold set at room temperature, or about 20° C., however the wafer will be heated up to about 50° C. The thickness is between about 2000 and 5000 Angstroms, and must be thick enough to even out roughness. (2) By any type of Al e-beam or evaporation. The grain size of this layer is less than about 0.5 micrometers, using either deposition method. Deposition at this temperature results in metal 46 being a fine-grain, highly reflective film. Aluminum layer 46 is pure aluminum, as any of the common additive materials such as Si or Cu (copper) could cause undesirable hillock growth during subsequent higher temperature processing, which would reduce the reflectivity of the top Al layer.

Figure 7:
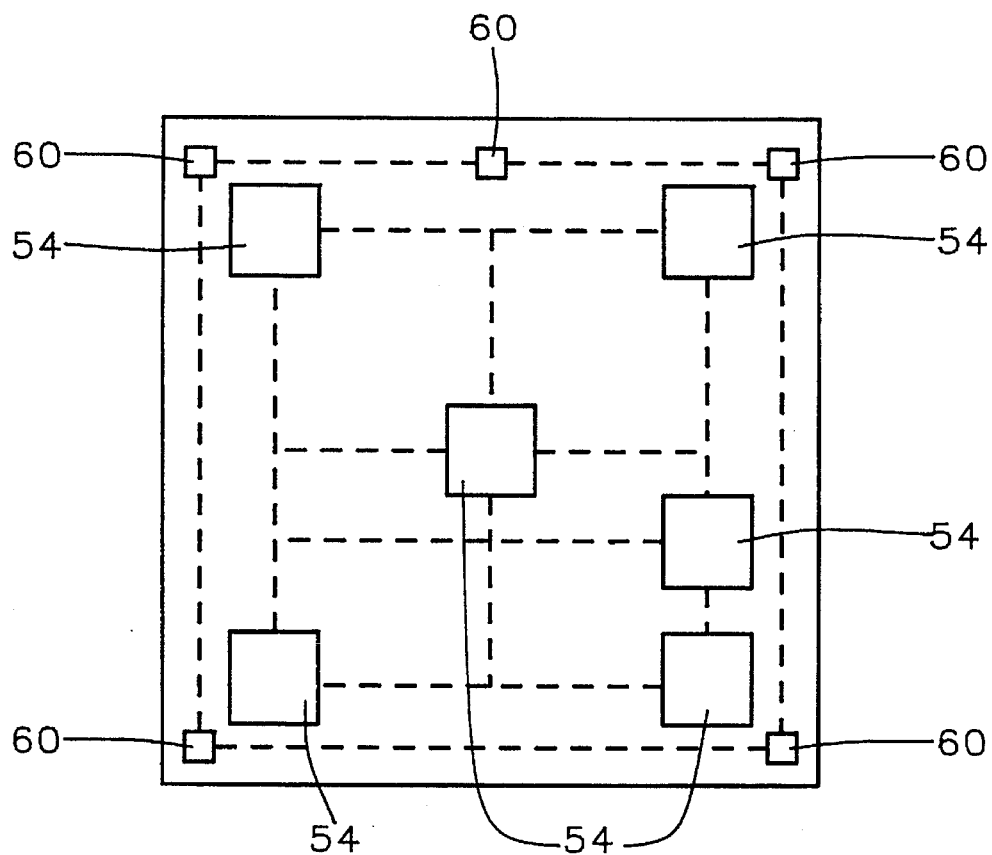
FIG. 7 is a schematic top view of the reflective metal plate of the invention on an integrated circuit chip having I/O pads at the periphery.

Referring now to FIG. 3, the top metal sandwich structure is etched to the desired size of the metal reflector plate. The plate dimensions are such that many reflective areas 54, as shown in the top view of FIG. 7, are formed on the integrated circuit within the surrounding bonding pads 60. The desired plate is defined by a photoresist formed by conventional lithography. The metal etch may be accomplished by either reactive ion etching, or a wet etch. A wet etch is accomplished with chemical species $BCl_3$ and $Cl_2$ (boron trichloride and chlorine). The resist is then stripped using standard stripping techniques.

Figure 4:
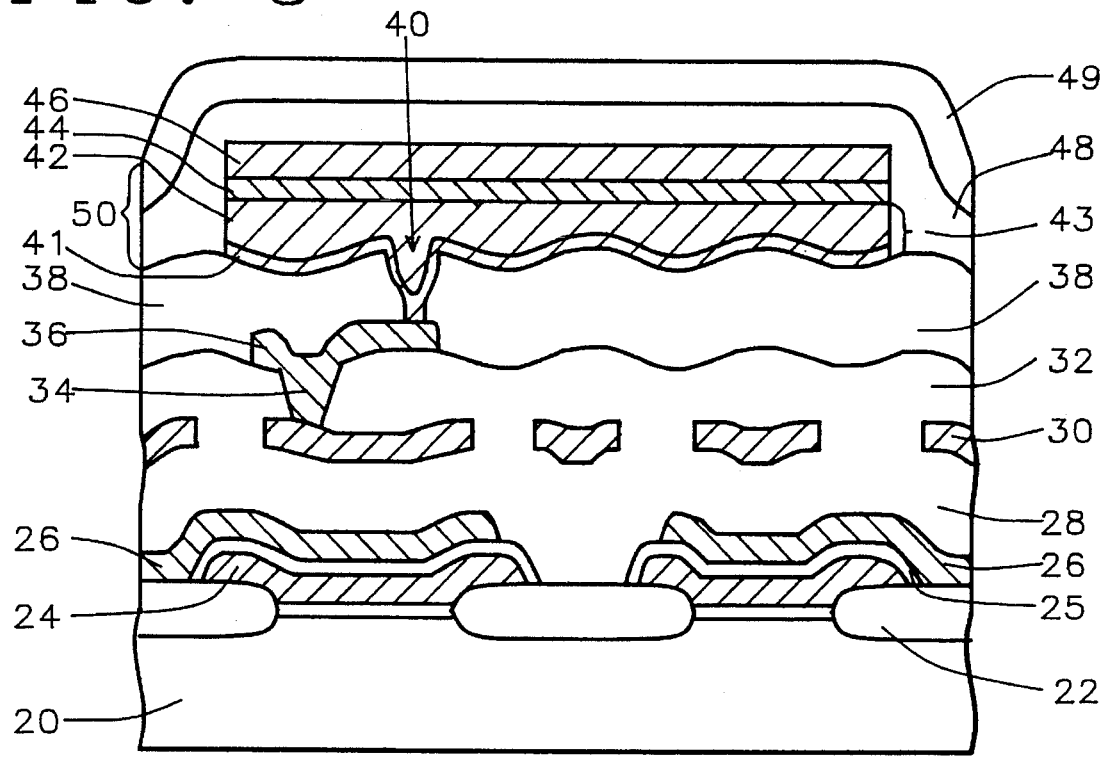

With reference to FIG. 4, passivation layer 50 is added as a final layer. This layer is formed of a sandwich of $SiO_x$ layer 48, which is a phosphosilicate glass (PSG) with 2–3% phosphorus, and $Si_3N_4$ (silicon nitride) layer 49. Each of these two layers is formed by PECVD (Plasma Enhanced Chemical Vapor Deposition) at less than 400° C. so that deposition would take about one minute each, to a thickness of between about 3000 and 5000 Angstroms.

Figure 5:
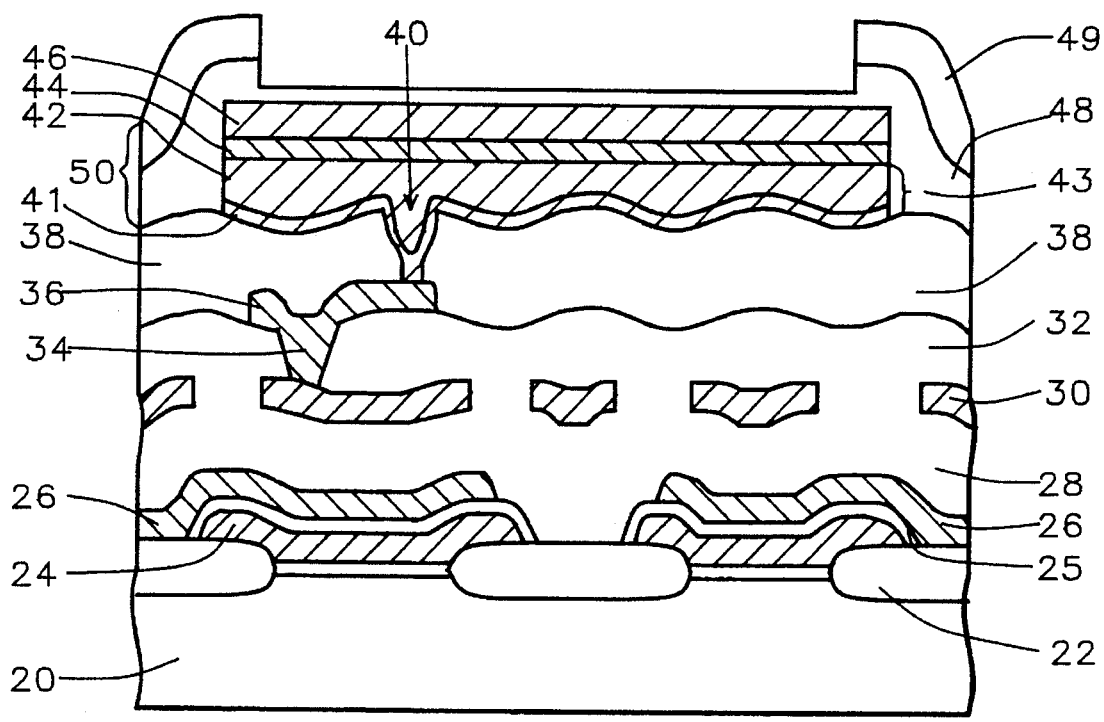
Figure 6:
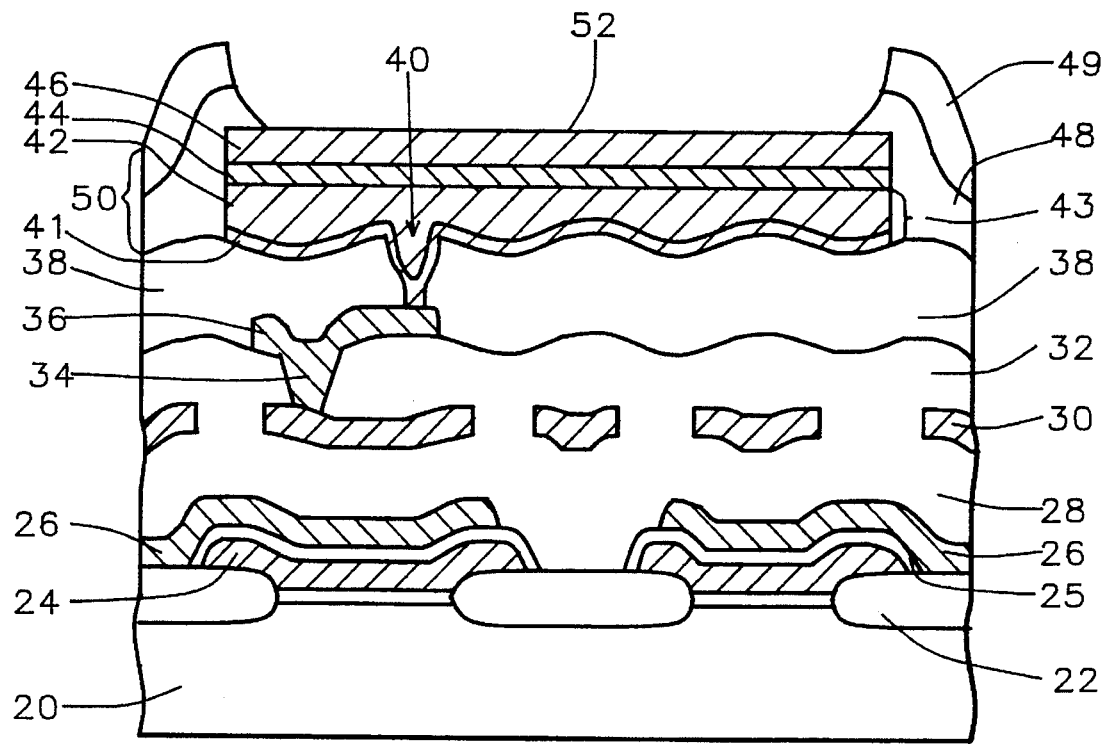

Referring now to FIGS. 5 and 6, a two-part etch is performed, to expose the metal reflector plate top surface. After conventional lithography and etching to define the area to be etched, a reactive ion etch is performed, to reduce the passivation layer 50 thickness to between about 500 and 1000 Angstroms in the region above the metal reflector plate. This is accomplished using a source gas that will etch both $SiO_x$ and $Si_3N_4$, such as $CF_4+O_2$ (carbon tetrafluoride+oxygen). The result is seen in FIG. 5. The second etch is a wet etch to remove the remainder of the passivation layer, which is $SiO_x$, over the metal reflector plate, as shown in FIG. 6. Buffered $HF/H_2O$ is used in this second etch to prevent pitting of the Al surface 52, which would occur if it were subjected to reactive ion dry etching conditions. The remaining photoresist is stripped with the completed structure as shown in FIG. 6.

The reflective layer may be defined for a wide range of size of metal reflector plates, depending upon the need of the virtual reality technologist who needs the integrated circuit have a reflective surface. The size of each reflective region 54, as seen in the FIG. 7 top view, can be smaller, the same size as, or larger than the I/O pads 60. Typical I/O pads are between about 90 and 120 micrometers on a side, to hundreds of micrometers on a side. The defined reflective surface might range from 15 micrometers on a side to hundreds of micrometers on a side. It is preferred for best planarity over the surface of the integrated circuit chip to have smaller rather than very large reflective regions 54.

While the invention has been particularly shown and described with reference to the preferred embodiments thereof, it will be understood by those skilled in the art that various changes in form and details may be made without departing from the spirit and scope of the invention.

What is claimed is:

1. An integrated circuit chip comprising:

a memory cell and associated circuitry on and within said integrated circuit chip;

a plurality of highly reflective surfaces formed on the surface of said integrated circuit chip wherein said reflective surfaces comprise:

a first layer of aluminum with a thickness of between about 1500 and 2000 Angstroms;

a second layer of aluminum with a thickness of between about 2000 and 5000 Angstroms, over said first layer of aluminum, having a grain size of between about 3 and 10 micrometers;

a conductive layer over said second layer of aluminum, with a thickness of between about 400 and 800 Angstroms;

a layer of pure aluminum over said layer of titanium, having a grain size of less than about 0.5 micrometers; and a plurality of I/O pads formed on the surface of said integrated circuit chip for I/O connections to said memory cell and associated circuitry.

2. The integrated circuit chip of claim 1 wherein said conductive layer is titanium.

3. The integrated circuit chip of claim 1 wherein said conductive layer is titanium nitride.

4. An integrated circuit chip, comprising:

a memory cell and associated circuitry on and within said integrated circuit chip;

a plurality of highly reflective surfaces formed on the surface of said integrated circuit chip, each of said highly reflective surfaces comprising:

a first layer of aluminum connected to said memory cell and associated circuitry;

a second layer of aluminum, over said first layer of aluminum, having a grain size of between about 3 and 10 micrometers;

a conductive layer over said second layer of aluminum; and a layer of pure aluminum over said conductive layer, having a grain size of less than about 0.5 micrometers.

5. The integrated circuit chip of claim 4 wherein said first layer of aluminum has a thickness of between about 1500 and 2000 Angstroms.

6. The integrated circuit chip of claim 4 wherein said second layer of aluminum has a thickness of between about 2000 and 5000 Angstroms.

7. The integrated circuit chip of claim 4 wherein said conductive layer has a thickness of between about 400 and 800 Angstroms.

8. The integrated circuit chip of claim 4 wherein said conductive layer is titanium.

9. The integrated circuit chip of claim 4 wherein said conductive layer is titanium nitride.

10. The integrated circuit chip of claim 4 wherein said reflective surfaces are larger than about 15 micrometers on a side.

11. A highly reflective surface formed on the surface of an integrated circuit chip, comprising:

a first layer of aluminum with a thickness of between about 1500 and 2000 Angstroms;

a second layer of aluminum with a thickness of between about 2000 and 5000 Angstroms, over said first layer of aluminum, having a grain size of between about 3 and 10 micrometers;

a conductive layer over said second layer of aluminum, with a thickness of between about 400 and 800 Angstroms; and a layer of pure aluminum over said conductive layer, having a grain size of less than about 0.5 micrometers.

12. The highly reflective surface of claim 11 wherein said conductive layer is titanium.

13. The highly reflective surface of claim 11 wherein said conductive layer is titanium nitride.

14. The highly reflective surface of claim 11 wherein said reflective surface is larger than about 15 micrometers on a side.

* * * * *